United States Patent
Hadlich et al.

(10) Patent No.: US 7,766,529 B2
(45) Date of Patent: Aug. 3, 2010

(54) LIGHT EMITTING DIODES, DISPLAY SYSTEMS, AND METHODS OF MANUFACTURING LIGHT EMITTING DIODES

(75) Inventors: Daniel E. Hadlich, Albuquerque, NM (US); Michael R. Praiswater, Albuquerque, NM (US); Randy M. Maner, Albuquerque, NM (US)

(73) Assignee: Honeywell International Inc., Morristown, NJ (US)

( * ) Notice: Subject to any disclaimer, the term of this patent is extended or adjusted under 35 U.S.C. 154(b) by 261 days.

(21) Appl. No.: 11/956,805

(22) Filed: Dec. 14, 2007

(65) Prior Publication Data

US 2009/0154194 A1 Jun. 18, 2009

(51) Int. Cl.
*F21V 7/04* (2006.01)

(52) U.S. Cl. .................... 362/612; 362/611
(58) Field of Classification Search ............. 362/612, 362/611
See application file for complete search history.

(56) References Cited

U.S. PATENT DOCUMENTS 5,489,771 A * 2/1996 Beach et al. ............. 250/205
2002/0191183 A1* 12/2002 Tandon et al. ............ 356/320

* cited by examiner

*Primary Examiner*—David V Bruce
(74) *Attorney, Agent, or Firm*—Ingrassia Fisher & Lorenz, P.C.

(57) ABSTRACT

Light emitting diodes, display systems, and manufacturing methods are provided. In an embodiment, by way of example only, a light emitting diode ("LED") include a die and a lens. The die is configured to emit wavelengths of light within a first predetermined spectral range. The lens is disposed on at least a portion of the die and is configured to filter the light emitted from the die such that a second predetermined spectral range is emitted from the LED.

20 Claims, 4 Drawing Sheets

LIGHT EMITTING DIODES, DISPLAY SYSTEMS, AND METHODS OF MANUFACTURING LIGHT EMITTING DIODES

TECHNICAL FIELD

The inventive subject matter generally relates to displays, and more particularly to display systems, such as liquid crystal displays, and light emitting diodes for use in the display systems.

BACKGROUND

Liquid crystal displays ("LCDs") and other display devices may be used to convey information to a viewer. LCDs may be implemented into a variety of electronic devices, and typically include at least a backlight assembly and a display panel. The backlight assembly includes a light source that illuminates the display panel and may also include one or more optical filters for disposal therebetween. The optical filters are used to block certain frequencies of light emitted from the light source to thereby enhance an image that is displayed on the display panel.

Although the optical filter of an LCD may block the emission of a substantial amount of light having wavelengths within a certain range of frequencies, improved blockage of such frequencies (e.g., close to 100%) may be preferred under some circumstances. For example, in some cases, an LCD may be used alongside other light filtering devices, such as a Night Vision Imaging System (NVIS). This type of system is typically used in a low light environment, such as in an aircraft cockpit during a night flight, to observe objects that may not otherwise be visible under such circumstances. The NVIS detects certain frequencies of light, such as infrared and/or near-infrared so that any object emitting such frequencies may appear to be relatively bright to a viewer. Thus, if an LCD used in proximity to an NVIS emits infrared and/or near-infrared frequencies, the emitted frequencies may interfere with the operation of the NVIS.

Accordingly, it is desirable to have an LCD that has improved filtering of certain frequencies of light. Moreover, it is desirable for the LCD and components thereof to be relatively simple and inexpensive to manufacture. Furthermore, other desirable features and characteristics of the inventive subject matter will become apparent from the subsequent detailed description of the inventive subject matter and the appended claims, taken in conjunction with the accompanying drawings and this background of the inventive subject matter.

BRIEF SUMMARY

Light emitting diodes, display systems, and manufacturing methods are provided.

In an embodiment, by way of example only, a light emitting diode ("LED") includes a die and a lens. The die is configured to emit wavelengths of light within a first predetermined spectral range. The lens is disposed on at least a portion of the die and is configured to filter the light emitted from the die such that a second predetermined spectral range is emitted from the LED.

In another embodiment, by way of example only, a display system includes a backlight assembly. The backlight assembly includes a substrate and a plurality of light emitting diodes mounted to the substrate. Each light emitting diode comprises a die configured to emit wavelengths of light within a first predetermined spectral range, and a lens disposed on at least a portion of the die, the lens configured to filter the light emitted from the die such that a second predetermined spectral range is emitted from the light emitting diode.

In still another embodiment, a method of manufacturing a display system is provided. The method includes forming a light emitting diode by forming a lens around a die configured to wavelengths within a first predetermined spectral range when energy is applied thereto, the lens comprising a material configured to filter the light of the die to allow emission of a different predetermined spectral range.

BRIEF DESCRIPTION OF THE DRAWINGS

The inventive subject matter will hereinafter be described in conjunction with the following drawing figures, wherein like numerals denote like elements.

DETAILED DESCRIPTION

The following detailed description is merely exemplary in nature and is not intended to limit the inventive subject matter or the application and uses of the inventive subject matter. Furthermore, there is no intention to be bound by any theory presented in the preceding background or the following detailed description.

Figure 1:
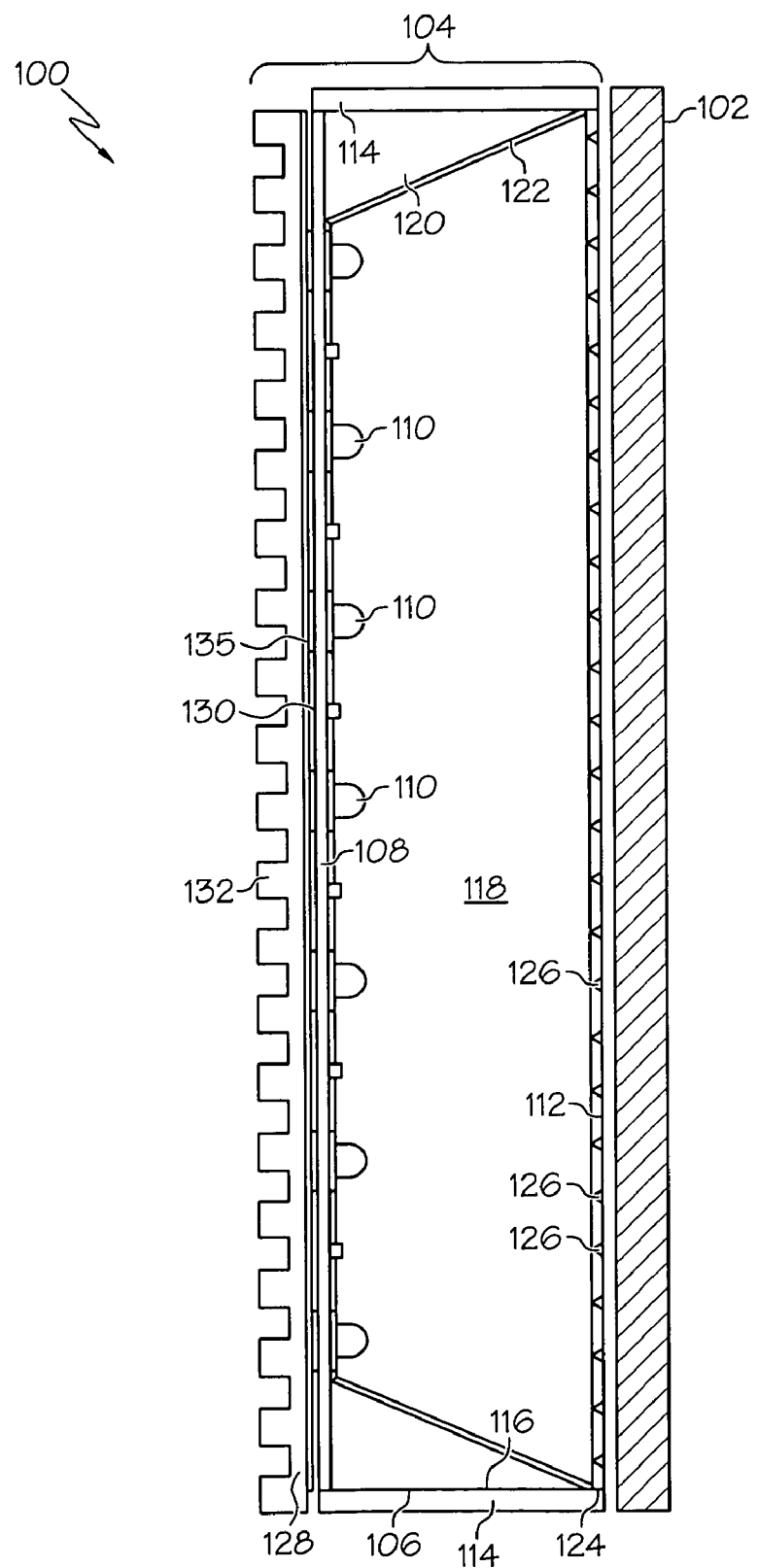
FIG. 1 is a cross-sectional side view of a display system, according to an embodiment.

FIG. 1 is a simplified, cross-sectional view of a display system 100, according to an embodiment. The display system 100 is used to convey information to a viewer by displaying one or more images. In an embodiment, the display system 100 may be a liquid crystal display and may include a display panel 102 and a backlight assembly 104 disposed adjacent thereto. The display panel 102 may be any conventional display panel that may be used as an interface with a viewer. In an embodiment, the display panel 102 may be a liquid crystal display panel. The backlight assembly 104, which may be spaced apart from or attached directly to the display panel 102, is configured to illuminate the display panel 102.

The backlight assembly 104 includes a housing 106, a substrate 108, a plurality of light emitting diodes ("LEDs") 110, and a diffuser 112. The housing 106 is configured to provide structure to the backlight assembly 104 and may include a plurality of sidewalls 114 that extend from the substrate 108. The sidewalls 114 may be fabricated from a material that does not transmit light, such as aluminum or plastic. Each sidewall 114 includes an inner surface 116 that, together with the substrate 108, forms a cavity 118. In another embodiment, the sidewall 114 may be attached to a backwall (not shown). In such case, the substrate 108 may be disposed along a surface of the backwall.

To optimize an amount of light that is supplied to the display panel 102, the inner surfaces 116 of the sidewalls 114 may be configured to reflect light. In an embodiment, a reflective material may be coated on the sidewall inner surfaces 116 and may have a thickness of from a few atoms thick to about 0.50 mm. In another embodiment, the inner surface 116 may be formed from the reflective material. The reflective material may be a diffusely reflective material or a specularly reflective material. Examples of suitable reflective materials include, but are not limited to, paint and polished metal. In still another embodiment, the shape of the cavity 118 may be configured to reflect a portion of the light. For example, instead of extending substantially perpendicular relative to the substrate 108 as shown in FIG. 1, the sidewalls 114 may alternatively slant outwardly away from each other. In another example, a separate structure 120 may be included to alter the shape of the cavity 118. In this regard, the structure 120 may have surfaces 122 that slant outwardly away from each other. In such case, the surfaces 122 may or may not include reflective material. In an embodiment, polytetrafluoroethylene may be employed in configurations in which a very high diffuse reflective surface is used in order to improve the efficiency of the backlight assembly 104. In another embodiment, the surfaces 122 may include non-reflective material to absorb selected wavelengths of light. Examples of the non-reflective, absorbtive material include, but are not limited to, paint, solder mask or other light-absorbing materials or surfaces. In any case, the reflective or non-reflective material may be included at a thickness of from a few atoms thick to about 0.50 mm The plurality of LEDs 110 provide light to the cavity 118 and the display panel 102 and are mounted to the substrate 108. In this regard, the substrate 108 may act as a circuit board for the LEDs 110 and may be made of any material conventionally used as a mounting board material for electrical components. For example, the substrate 108 may be made of molded glass epoxy resin.

As mentioned briefly above, the backlight assembly 104 may also include a diffuser 112. The diffuser 112 is configured to receive the light from the plurality of LEDs 110 and/or the cavity 118 and to diffuse the light so that it is more evenly distributed to the display panel 102. In an embodiment, the diffuser 112 encloses the cavity 118 such that substantially all of the light from the cavity 118 passes through the diffuser. For instance, the diffuser 112 may be disposed in the cavity 118 and may have an outer edge 124 that forms a tight fit with the inner surface of the housing sidewalls 114. In other embodiments, the diffuser 112 may be disposed over the sidewalls 114. In still other embodiments, the diffuser 112 may be spaced apart from the sidewalls 114.

The diffuser 112 may be made of any suitable material capable of diffusing light. Suitable materials include, for example, polycarbonate, acrylic, and polyester. In some embodiments, the diffuser 112 may be made of a transparent material having surface features 126 that may refract light passing therethrough. For example, the surface features 126 may be specially designed bumps or notches formed in or on the diffuser 112.

Figure 2:
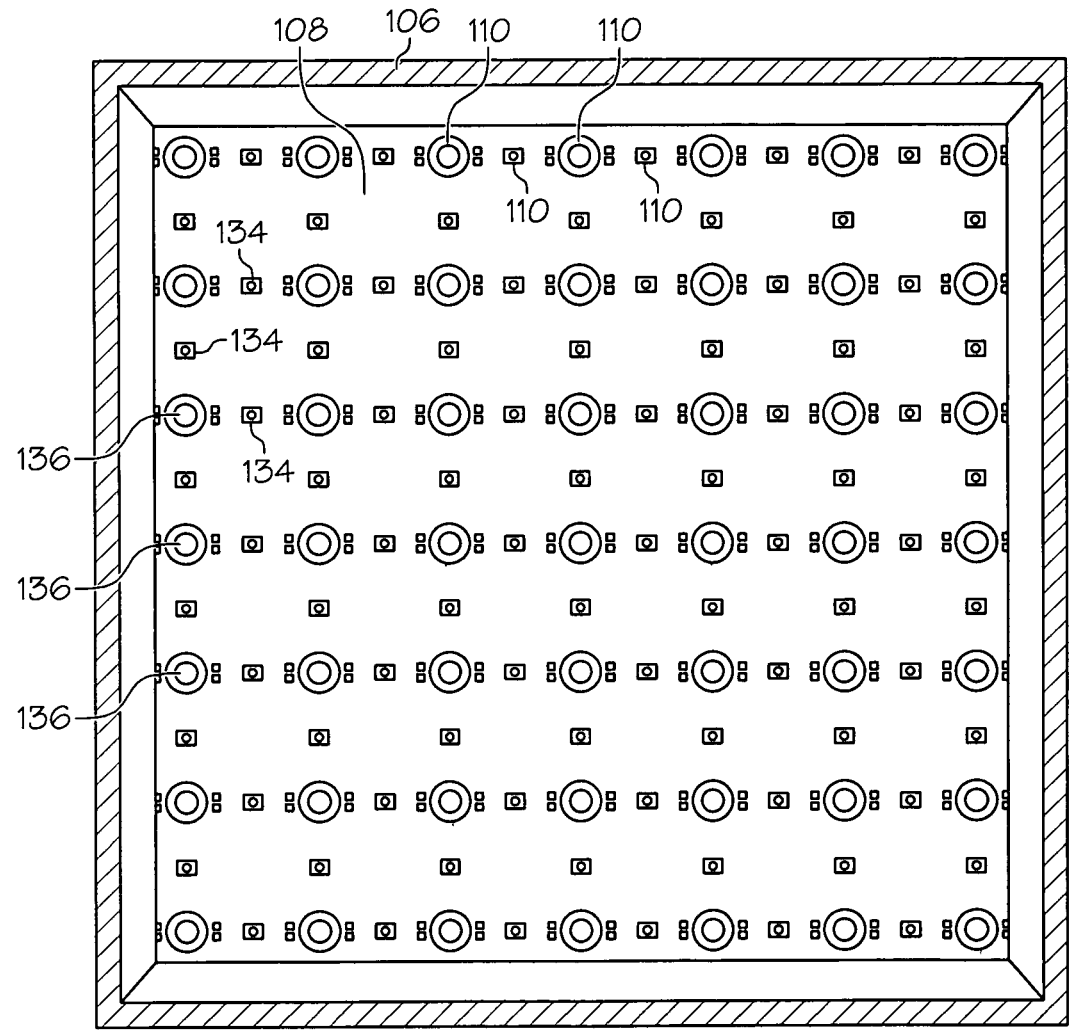
FIG. 2 is a top view of a portion of the display system of FIG. 1 including a housing, a substrate, and a plurality of light emitting diodes, according to an embodiment.

During operation of the display system 100, heat energy may be emitted from the backlight assembly 104. In this regard, a heat sink 128 may be attached to a portion of the backlight assembly 104. For example, and as shown in FIG. 1, the heat sink 128 may be coupled to an external surface 130 of the substrate 108. The heat sink 128 may be any conventional structure used to dissipate heat. To improve heat dissipation, features such as fins 132 may protrude from the heat sink 128. In another embodiment, heat conduction may be enhanced by an intermediate plate 135 that may be disposed between the substrate 108 and heat sink 128. The intermediate plate 135 may be made of a thermally conductive electrically nonconductive material and may have a thickness of between about 0.127 mm and 1.27 mm Turning now to FIG. 2, a top view of a portion of the display system 100 of FIG. 1 including the housing 106, the substrate 108, and the plurality of light emitting diodes 110 is shown, according to an embodiment. The plurality of LEDs 110 may be arranged in a plurality of rows and columns. For example, thirteen rows and thirteen columns are included on the substrate 108, however fewer or more, such as hundreds or thousands of rows and columns, may alternatively be employed, in other embodiments. The rows and columns may extend parallel with the width and/or the length of the display panel 102 (FIG. 1). In an embodiment, each row or column may include the same number of LEDs 110. In other embodiments, such as the depicted embodiment, some rows may include a first number of LEDs, while other rows may include a second number of LEDs. Similarly, some columns may include a second number of LEDs and other columns may include other numbers of LEDs. Here, thirteen LEDs are illustrated in one row and seven LEDs are illustrated in another row; however, in other embodiments, fewer or more LEDs may be included in each row or column. As alluded to above, the LEDs 110 may be electrically coupled to each other and/or control circuitry via conductive traces or vias (not shown). The conductive traces and/or vias may be formed on or within the substrate 108 and may be made up of wires, traces of conductive material, and/or various other circuitry In an embodiment, the rows of LEDs 110 may be made up of one or more types of LEDs. For example, a first type of LED 134 may be capable of emitting light in a first spectral range, while a second type of LED 136 may be capable of emitting light in a second spectral range. The second spectral range may or may not overlap the first spectral range. Whether the two ranges overlap and how much the ranges overlap may depend, in part, on an intended use of the display 100. For example, in an embodiment, the display 100 may be selectively used in a day or night mode. The day mode may allow a viewer to view images on the display panel 102 when ambient light is present, while the night mode may allow a viewer to view images on the display panel 102 without the light from the display 100 interfering with an operation of a night view enhancement device. In an embodiment, the first type of LEDs 134 may be used only in the night mode, while the second type of LEDs 136 may be used only in the day mode. In such case, each may have a spectral range (e.g., first and second spectral ranges, respectively) and the spectral ranges may overlap. In an example, the first spectral range of light emitted by the first type of LEDs 134 may be a range of between about 380 nm and 650 nm, while the second spectral range of light emitted by the second type of LEDs 136 may be a range of between about 380 nm and 730 nm. The text we deleted is not accurate.

Figure 3:
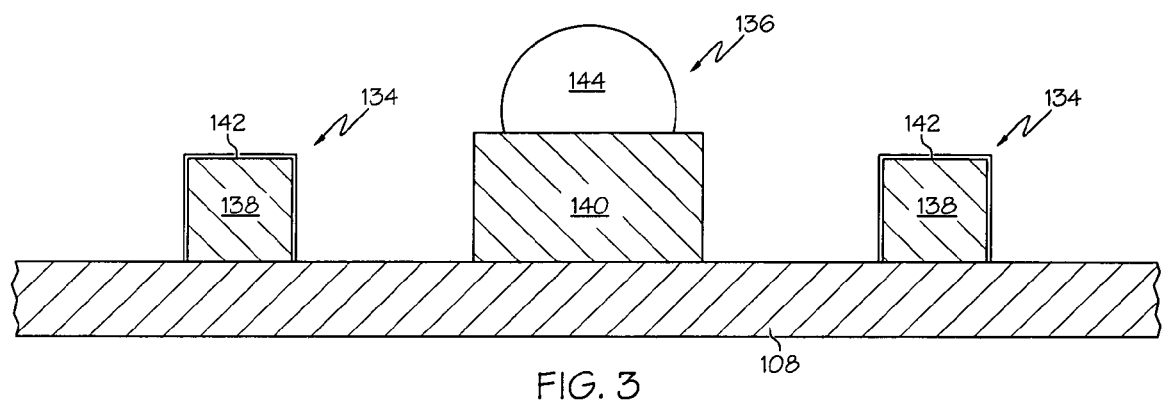
FIG. 3 is a close up, cross-sectional side view of a portion of a substrate including light emitting diodes, according to an embodiment.

In some embodiments, it may be desirable for the spectral emission from the first type of LEDs 134 not to overlap the spectral emission from the second type of LEDs 136. In this regard, at least one of the first and the second types of LEDs 134, 136 may be made up of a die, and one or both of the LED types may be used in conjunction with a lens. FIG. 3 is a close up side view of a portion of the substrate 108, according to an embodiment. The dies 138, 140 may each comprise a semiconductor material that is doped with an element allowing the dies 138, 140 to emit a particular spectrum of light when a current is conducted therethrough. In an embodiment, the dies 138, 140 are configured to emit the same wavelengths within a first predetermined spectral range. The first predetermined spectral range may be a spectral range for visible light. However, in other embodiments, the first predetermined spectral range may be within a range for sub-components of visible light, such as red, blue, green, or other visible or non-visible light sub-spectra such at ultraviolet (UV) and infrared (IR).

Each lens 142, 144 may be configured to filter the first predetermined spectral range of light emitted from the die 138, 140 such that a different predetermined spectral range is emitted from the LED 134, 136. Each lens 142, 144 may be disposed on at least a portion of the die 138, 140 and may have a shape allowing substantially all of the light from the die 138, 140 to be transmitted. In an embodiment, a first type of lens 142 may surround substantially all of the die 138. In another embodiment, a second type of lens 144 may have a bulbous shape and may be disposed directly over a portion of a die 140, wherein the portion of the die 140 is configured to emit light.

The lenses 142, 144 may be made of a material used to form conventional optical filters. The material may be configured to filter light by rejecting (or inhibiting transmission), reflecting or absorbing selected wavelengths (or frequencies) of light. Suitable filter materials include, but are not limited to, dichroic (mirror) coating material and absorptive material (such as dye-based colorants). The filter material may be molded around at least a portion of the die 138, 140 and, in some embodiments, the filter material may be cured to thereby form the lens 142, 144. In another embodiment, the die 138, 140 may be dipped into a liquid phase of the filter material and dried or cured to form the lens 142, 144. In another embodiment, the filter material may be sputtered, evaporated or otherwise deposited upon the die 138, 140 or lens 142, 144.

Figure 4:
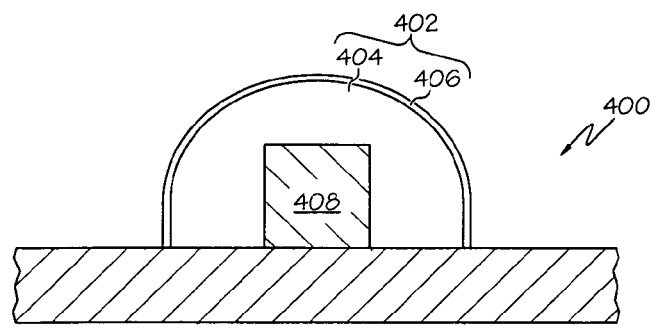
FIG. 4 is a cross-sectional side view of a light emitting diode, according to an embodiment.

In an alternative embodiment, the lens 142, 144 may be specifically constructed from a plurality of materials that form a filter to filter out certain wavelengths of light. FIG. 4 is a cross-sectional view of an LED 400, according to such an embodiment. Here, the lens 402 of the LED 400 is made up of a base 404 and a coating 406. The base 404 includes the die 408 embedded therein and may be any material capable of emitting light from the die 408. In an embodiment, the base 404 may be made of a material capable of filtering wavelengths within a particular spectral range. Suitable filter materials include, but are not limited to, dichroic (mirror) coating material and absorptive material (such as dye-based colorants). In another embodiment, the base 404 may be made of a non-filtering material capable of allowing substantially all of the light emitted from the die 408 through. Suitable non-filtering materials include, but are not limited to glass, plastic, and silicone The coating 406 may overlay the base 404 to cooperate therewith to filter out certain wavelengths of light. In an embodiment, the coating 406 may be a dye, such as a liquid coating, or other material that is formulated to allow emission of light received from the base 404 and to filter the received light such that certain wavelengths thereof are prevented from passing through. Suitable filter materials include, but are not limited to, dichroic (mirror) coating material and absorptive material (such as dye-based colorants). Additionally, the material may be deposited onto the base 404 by any of numerous conventional deposition techniques, such as by chemical vapor deposition, sputtering, evaportion, and physical application. In other embodiments, the coating 406 may be molded over the base 404, or the die 408 may be dipped into a liquid form of the material that may be used to make up the coating 406. In still other embodiments, the material may be deposited such that more than one layer is disposed over the base 404 to thereby form a multi-layered coating 406.

The selection of the lens material may depend on a desired spectral range to be filtered. For example, returning to FIG. 3 and as mentioned above, the first type of LEDs 134 may be used in relatively low light situations in conjunction with devices that are particularly sensitive to emissions within a particular spectral range, such as night vision enhancement devices that are sensitive to infrared and/or near infrared lightwaves. In such case, the lens 142 of the first type of LEDs 134 may be configured to have a high transmission (e.g., >80%) of light in the visible spectrum (i.e., spectral range between approximately 380-650 nm) and filtering of wavelengths in a spectral range in which the night vision system may have sensitivity (e.g., between about 570 nm and about 930 nm). In an embodiment, the light emitted from the die 138 may have broadband phosphorescence, and the material for the lens 142 may be selected or constructed to filter out (e.g., block) near-infrared energy from approximately 650 nm to at least 930 nm. In another embodiment, the material may be selected or constructed to filter wavelengths further into the near-infrared region (e.g., 750 nm to 930 nm). Such an embodiment may be employed in configurations in which the first type of LEDs 134 are typically used in conjunction with the second type of LEDs 136 to provide light for daytime use.

Figure 5:
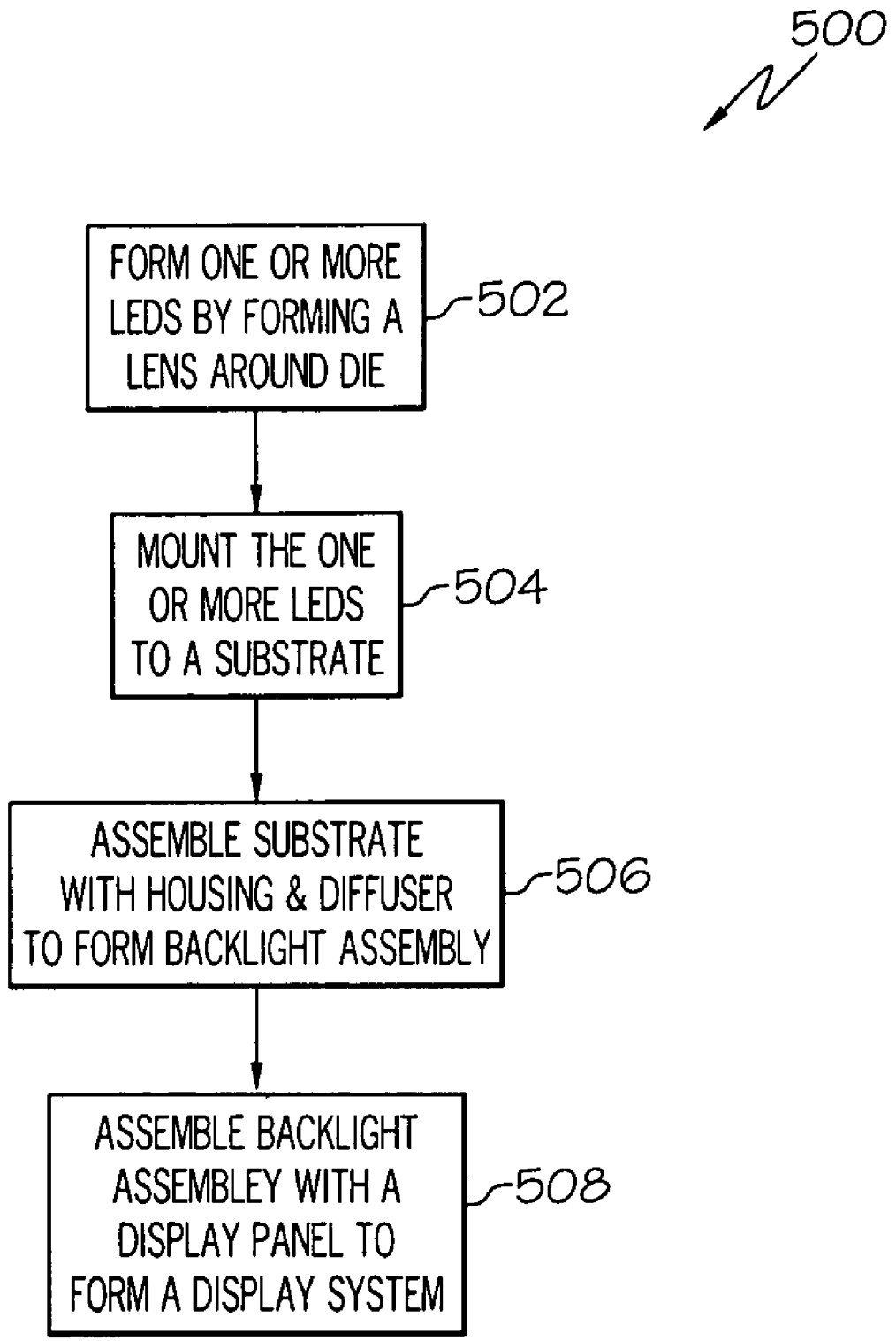
FIG. 5 is a method of manufacturing a display system, according to an embodiment

A display system may be manufactured according to a method 500 shown in FIG. 5. Here, one or more LEDs are formed by forming a lens around a die configured to emit wavelengths within a first predetermined spectral range when energy is applied thereto, step 502. The lens comprises a material configured to filter the light of the die to allow emission of a second predetermined spectral range. In an embodiment, the filter material may be deposited over a portion of the die to form the lens to form the LED. In still another embodiment, the filter material may be molded over a portion of the die to form the lens to form the LED. In another embodiment, two types of LEDs may be formed. Thus, the lenses of each type of LED may be configured to filter emissions within different spectral ranges. One or more LEDs may then be mounted on a substrate, step 504. In an embodiment, the substrate may then be assembled with a housing and diffuser to form a backlight assembly, step 506. The backlight assembly may then be assembled with a display panel (e.g., an LCD panel) to form a display system, step 508.

A display system has now been provided that may have improved filtering capabilities of certain frequencies of light, as compared with conventional display systems. In particular, because each LED used in the display system includes a lens that is configured to filter the light emitted from the die and that surrounds the die, the spectral range of light emitted from the LED and the display may be more easily controlled than in conventional display systems. Because the filtering capabilities may be incorporated into the LEDs used in the system, additional optical filters, such as those used in conventional LCDs may not be needed. Thus, the aforementioned display systems may be simpler and less expensive to manufacture than conventional systems. It will be appreciated that although the LEDs taught above are described as being incorporated into a backlight system, they may be incorporated into other applications. For example, the LEDs may alternatively be implemented into any system in which filtered light may be used, such as in other types of display systems, in general lighting fixtures, in projection systems, in automotive lighting or in other lighting systems.

While at least one exemplary embodiment has been presented in the foregoing detailed description of the inventive subject matter, it should be appreciated that a vast number of variations exist. It should also be appreciated that the exemplary embodiment or exemplary embodiments are only examples, and are not intended to limit the scope, applicability, or configuration of the inventive subject matter in any way. Rather, the foregoing detailed description will provide those skilled in the art with a convenient road map for implementing an exemplary embodiment of the inventive subject matter. It being understood that various changes may be made in the function and arrangement of elements described in an exemplary embodiment without departing from the scope of the inventive subject matter as set forth in the appended claims.

What is claimed is:

1. A light emitting diode, comprising:
   a die configured to emit wavelengths of light within a first predetermined spectral range; and
   a lens disposed directly on at least a portion of the die, the lens configured to filter the light emitted from the die such that a second predetermined spectral range is emitted from the LED.

2. The light emitting diode of claim 1, wherein the lens surrounds substantially all of the die.

3. The light emitting diode of claim 1, wherein the lens is disposed directly over a portion of the die, wherein the portion of the die is configured to emit the wavelengths of light.

4. The light emitting diode of claim 1, wherein the lens comprises a coating that is disposed over the die.

5. The light emitting diode of claim 1, wherein the lens comprises a multi-layered coating.

6. The light emitting diode of claim 1, wherein the lens is formed from a dye-based colorant material.

7. The light emitting diode of claim 1, wherein the lens is coated with a dichroic coating.

8. The light emitting diode of claim 1, wherein the first predetermined spectral range includes wavelengths for the emission of visible light.

9. A display system, comprising:
   a backlight assembly including:
      a substrate, and
      a plurality of light emitting diodes mounted to the substrate, each light emitting diode comprising:
         a die configured to emit wavelengths of light within a first predetermined spectral range; and
         a lens disposed directly on at least a portion of the die, the lens configured to filter the light emitted from the die such that a second predetermined spectral range is emitted from the light emitting diode.

10. The display system of claim 9, wherein the plurality of light emitting diodes comprises a first type of light emitting diode and a second type of light emitting diode, the first type of light emitting diode configured to emit light within a first spectral range and the second type of light emitting diode configured to emit light within a second spectral range.

11. The display system of claim 9, wherein the first spectral range overlaps the second spectral range.

12. The display system of claim 9, wherein the first spectral range includes wavelengths between about 380 nm and about 650 nm and the second spectral range includes wavelengths between about 380 nm and about 730 nm.

13. The display system of claim 9, further comprising a display panel disposed adjacent to the backlight assembly.

14. The display system of claim 9, wherein the lens surrounds substantially all of the die.

15. The display system of claim 9, wherein the lens is disposed directly over a portion of the die, wherein the portion of the die is configured to emit the wavelengths of light.

16. The display system of claim 9, wherein the lens comprises a coating that is disposed over the die.

17. The display system of claim 9, wherein the first predetermined spectral range includes wavelengths for the emission of visible light.

18. A method of manufacturing a display system, the method comprising the steps of:
   forming a light emitting diode by forming a lens directly on a die, the die configured to emit wavelengths within a first predetermined spectral range when energy is applied thereto, the lens comprising a material configured to filter the wavelengths emitted from the die to allow emission of a different predetermined spectral range.

19. The method of claim 18, wherein the step of forming comprises depositing a filter material over a portion of the die to form the lens.

20. The method of claim 18, wherein the step of forming comprises molding a filter material around a portion of the die to form the lens.

* * * * *